United States Patent [19]

Matsumura et al.

[11] Patent Number: 5,227,044
[45] Date of Patent: Jul. 13, 1993

[54] PROCESS FOR PRODUCING MULTICOLOR DISPLAY

[75] Inventors: Akira Matsumura, Hirakata; Masashi Ohata, Neyagawa, both of Japan

[73] Assignee: Nippon Paint Co., Ltd.

[21] Appl. No.: 925,128

[22] Filed: Aug. 6, 1992

[30] Foreign Application Priority Data

Aug. 6, 1991 [JP] Japan .................................. 3-196554

[51] Int. Cl.⁵ ................................................ C25D 5/02
[52] U.S. Cl. ...................................... 205/118; 205/122
[58] Field of Search ............................... 205/118, 122

[56] References Cited

U.S. PATENT DOCUMENTS 4,873,178 10/1989 Haruta .................................. 205/122

Primary Examiner—T. M. Tufariello
Attorney, Agent, or Firm—Wenderoth, Lind & Ponack

[57] ABSTRACT

The present invention provides a process for producing a multicolor display without a photolithographic process which requires registration. The process comprises forming a transparent electroconductive layer on a transparent substrate, forming a desired colored layer patterned thereon, and subjecting the transparent electroconductive layer exposed between the gap of the patterned colored layers to a metal electroplating (or electrolytic reduction) to form a light-shielding layer.

5 Claims, 1 Drawing Sheet

PROCESS FOR PRODUCING MULTICOLOR DISPLAY

FIELD OF THE INVENTION

The present invention relates to a process for producing a multicolor display used for multi-coloring display elements such as liquid crystal and the like.

BACKGROUND OF THE INVENTION

Normally, a multicolor display (color filter) used for multi-coloring display elements such as liquid crystal and the like comprises red, green and blue pixel parts and a black stripe increasing a contrast between the above pixel parts. As shown in FIG. 2 (a) to FIG. 2 (c), a conventional color filter had hitherto been produced by selectively forming a black stripe 12 on a transparent substrate 11 and then selectively forming a desired colored filter 13 between the gap of the black stripes according to a dyeing method, pigment dispersing method, printing method and the like (e.g. Japanese Patent Kokai No. 63-91627).

However, the production process of the conventional color filter requires an aligning process wherein a color filter is formed precisely between the gap of the black stripes (a light-shielding film), as is apparent from FIG. 2 (a) to FIG. 2 (c). The aligning process makes the whole process complicated and results in a low yield.

In order to eliminate this drawback, there is disclosed in Japanese Patent Kokai No. 62-247331 a method which comprises forming a color filter on a patterned transparent conductive layer by an electrodeposition method, forming a negative type resist containing a black colorant thereon and then allowing it to remain between the color filters selectively by photolithograpy. However, in this method, at least one photolithographic step must be added and, therefore, yield is liable to be lowered.

OBJECTS OF THE INVENTION

Main object of the present invention is to provide a process for producing a color filter which contains black stripes having a high light-shielding ability between color filter patterns. The process does not have the above mentioned problems, such as a low yield and a complication of the process.

This object as well as other objects and advantages of the preset invention will become apparent to those skilled in the art from the following description with reference to the accompanying drawing.

SUMMARY OF THE INVENTION

According to the present invention, there is provided a process for producing a multicolor display which comprises:

(a) forming a transparent electroconductive layer on a transparent substrate;

(b) forming a desired color layer patterned thereon; and (c) subjecting the transparent electroconductive layer present exposed between the gap of the patterned colored layers to metal electroplating (or electrolytic reduction) to form a light-shielding layer (e.g. black stripes).

DETAILED DESCRIPTION OF THE INVENTION

Figure 1A:
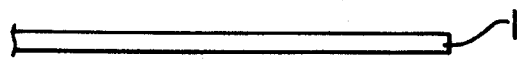
FIGS. 1 (a) to 1 (e) are flow sheets illustrating one preferred embodiment of the process for producing a color filter with shade membrane of the present invention.
Figure 1B:
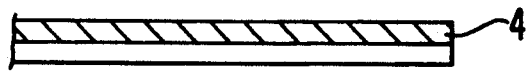
Figure 1C:
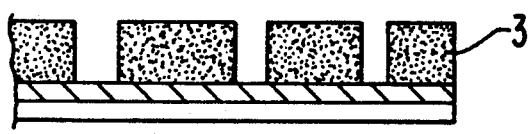
Figure 1D:
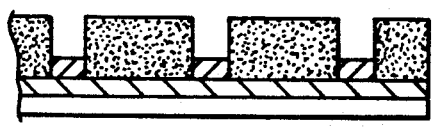
Figure 1E:
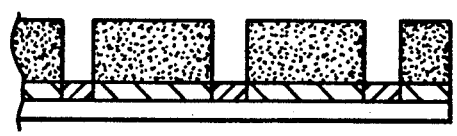
Figure 2A:
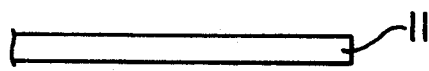
FIGS. 2 (a) to 2 (c) are flow sheets illustrating the process for producing a conventional color filter.
Figure 2B:
Figure 2C:
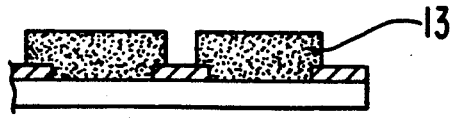

As shown in FIGS. 1 (a) and 1 (b), a transparent electroconductive layer 4 is firstly formed on a transparent substrate 1. The transparent substrate may be anyone which is normally used for multicolor display and examples thereof include glass substrate, plastic substrate and the like. As the transparent electroconductive layer, for example, those containing tin oxide, indium oxide, antimony oxide and the like as a main component are suitable used. The transparent electroconductive layer is formed by an art-known method such as deposition, spattering and the like.

Then, a colored layer 3 is formed on the conductive membrane 4, as shown in FIG. 1 (c). The method for forming the colored layer may be various conventional methods and examples thereof include pigment dispersing method disclosed in Japanese Patent Kokai No. 1-152449, dyeing method disclosed in Japanese Patent Kokai No. 63-91627, printing method disclosed in Japanese Patent Kokai No. 63-66501, resist direct electrodeposition method disclosed in Japanese Patent Kokai No. 3-12018 and the like.

As shown in FIG. 1 (d), by subjecting the top surface of the transparent electroconductive layer present exposed between the gap of the colored layers which is formed on the electroconductive layer to metal electroplating, a light-shielding layer can be easily formed between the gap. The metal electroplating method for forming the metallic light-shielding layer is known to the art and for example, chrome plating, nickel plating, copper plating and the like, and chrome plating is preferred. The composition of a plating bath and plating conditions are known to the art. For example, in the case of chrome plating, plating is conducted at 1 to 10 V for 1 to 15 minutes in a normal chrome plating bath.

Similarly, as shown in FIG. 1 (e), by subjecting the top surface of the transparent electroconductive layer present exposed between the gap of the colored layers which is formed on the electroconductive layer to electric reduction, a light-shielding layer can be easily formed between the gap. In the case of the electrolytic reduction, the transparent electroconductive layer itself is reduced in a solution by applying an electric current to convert it into a light-shielding layer. This conversion is only conducted at the part at which the electric current can be applied. This is different from the above mentioned electroplating method. The electrolytic reduction process itself is known to the art.

In the color filter thus obtained, transmission of light is scarcely arisen due to the light-shielding layer and no light peeps through the gap of the filter patterns because the light-shielding layer is uniformly formed by applying the electric current to the electroconductive layer, which results in remarkable improvement of a color contrast. In addition, since no photolithographic process is used, no complicated alignment process is required and yield on production is scarcely lowered. The color filter of the present invention is chemically stable and has high reliability.

EXAMPLES

The following Examples further illustrate the present invention in detail but are not construed to limit the scope thereof.

EXAMPLE 1

In FIG. 1 (a), a normal glass substrate was used as a transparent substrate 1 and a transparent conductive membrane 4 was formed thereon (FIG. 1 (b)). In this example, ITO (indium-tin-oxide) was deposited in a thickness of about 1500 Å (50 Ω /□) by a deposition method.

A positive type photosensitive resin composition was applied on the transparent conductive membrane 4 by a spinner 4, which was dried to form a positive photosensitive resin composition layer on the transparent conductive membrane.

Then, it was exposed to a high pressure mercury lamp through a mask having a predetermined pattern and heated at 100° C. for 3 minutes. After developing with an alkai solution, a salt was formed at the exposed part to elute off, which resulted in exposure of the surface of the transparent electroconductive layer 4. Then, the substrate 1 wherein the transparent electroconductive layer 4 was exposed was immersed in an electrodeposition bath of a red cationic photosensitive electrodepositable resin composition and a direct current of 5 volt was applied for 30 seconds using a transparent conductive layer as a negative electrode. Thereafter, the substrate was taken out and sufficiently rinsed with water. In this case, the electrodepositable composition was not deposited onto the positive type photosensitive resin composition on the transparent conductive membrane and was removed by rinsing with water. However, a polymer deposited on the electrode to which an electric current was applied become insoluble to water and, therefore, it could not be removed by rinsing with water. After rinsing and drying, a colored polymer layer having good transparency was formed.

Then, the substrate was exposed to a high pressure mercury lamp through a mask 4 having a shifted pattern and heated at 100° C. for 3 minutes. After developing with an alkali solution, the surface of the transparent conductive membrane 4 was exposed, similarly. Then, the substrate 1, wherein the transparent electroconductive layer 4 was exposed and the red colored layer was formed, was immersed in an electrodeposition bath of a green cationic photosensitive electrodepositable resin composition and a direct current of 5 volt was applied for 45 seconds using the transparent conductive layer as a negative electrode. Thereafter, the substrate was taken out and sufficiently rinsed with water. In this case, a green electrodepositable composition was not deposited onto the positive type photosensitive resin composition and the red colored layer on the transparent conductive membrane and was removed by rinsings with water. After rinsing and drying, a green polymer membrane having good transparency was formed.

Further, the substrate was exposed through a mask 4 having a shifted pattern, heated and developed and, then, a blue electrodepositable composition was deposited by applying a direct current of 5 volt for 30 seconds. After rinsing and drying, a blue polymer membrane was formed, similarly.

The total surface of the substrate wherein the remainder of the positive type photosensitive resin composition as well as red, green and blue colored layers were formed was exposed to a high pressure mercury lamp. After developing with an alkali solution, the positive type photosensitive resin composition was eluted except the colored layer, which results in exposure of the surface of the transparent conductive membrane 4.

The substrate of FIG. 1 (c) as a cathode was immersed in the following chrome plating bath. After a current of 5 volt was applied for 20 seconds using a lead-tin alloy plate as an anode, a chrome plating was easily introduced between the gap of the patterns (FIG. 1 (d)).

| (Chrome plating bath) | |
|---|---|
| Ingredients | Amount |
| Anhydrous chromic acid | 400 g/l |
| Sodium hydroxide | 60 g/l |
| Barium carbonate | 7.5 g/l |
| Silicofluoric acid | 1.0 ml/l |

Regarding a color filter with chrome light-shielding layer thus obtained in Example 1, no light peeps through the gap of the color filters and an optical density (OD value) of the light-shielding layer is high (3.0), whereby a color contrast was remarkably improved.

EXAMPLE 2

According to the same manner as that described in Example 1, a substrate of FIG. 1 (b) was made. Then, a bichromic acid-gelatin solution (prepared by dissolving 5 g of an ammonium bichromate solution, 1 g of a 2% chrome alum solution and 10 g of distilled water are dissolved in 25 g of vistalon) was spincoated on the substrate at 1000 rpm. It was prebaked at 70° C. for 20 minutes and then exposed to a 500 W ultra high pressure mercury lamp for 30 seconds through a desired patterned mask. After developing with flowing water for one minute, gelatin was dyed by immersing in a red dye solution to form a red pixel.

Then, according to the same manner as that described above except that the bichromic acid-gelatin solution was applied again on the pixel surface and a green dye solution was used in place of the red dye solution, a green pixel was formed next to the red pixel. Similarly, a substrate of FIG. 1c wherein a blue pixel was formed next to the red and green pixels was made, using a blue dye solution.

A substrate of FIG. 1 (c) as a cathode was immersed in a hydrochloric acid solution (concentration of 4%). After applying a current of 25 volt for 5 seconds using a stainless steel electrode as an anode, ITO was reduced electrolytically between the gap of the patterning pixels, uniformly, whereby a black membrane was easily introduced (FIG. 1 (e)).

Regarding a color filter with reduced ITO light-shielding layer obtained in Example 2, no light peeps through the gap of the color filters and an optical density (OD value) of the light-shielding layer is high (2.8), whereby a color contrast was remarkably improved.

According to the present invention, by applying an electric current to a transparent electroconductive layer of which top surface is deposited between the gap of the color filters, a metal light-shielding layer is easily formed between the color filters and, therefore, a complicated process such as registration between pixels of the color filter and the light-shielding layer is not required.

What is claimed is:

1. A process for producing a multicolor display which comprises:
   (a) forming a transparent electroconductive layer on a transparent substrate;
   (b) forming a desired colored layer patterned thereon; and
   (c) subjecting the transparent electroconductive layer exposed between the gap of the patterned colored layers to a metal electroplating to form a light-shielding layer.

2. The process according to claim 1 wherein said transparent electroconductive layer is indium oxide.

3. The process according to claim 1 wherein said metal electrolating is chrome plating.

4. A process for producing a multicolor display which comprises:
   (a) forming a transparent electroconductive layer on a transparent substrate;
   (b) forming a desired patterned colored layer patterned thereon; and
   (c) subjecting the transparent electroconductive layer exposed between the gap of the patterned colored layers to an electrolytic reduction to form a light-shielding layer.

5. The process according to claim 4 wherein said transparent electroconductive layer is indium oxide.

* * * * *